US012394622B2

(12) United States Patent
Schlom et al.

(10) Patent No.: US 12,394,622 B2
(45) Date of Patent: Aug. 19, 2025

(54) CORRELATED ORBITALS YIELD HIGH-MOBILITY, BACK-END-OF-LINE COMPATIBLE P-TYPE OXIDE SEMICONDUCTOR

(71) Applicant: Cornell University, Ithaca, NY (US)

(72) Inventors: Darrell G. Schlom, Ithaca, NY (US); Jiaxin Sun, Fremont, CA (US); Jisung Park, Sunnyvale, CA (US); Kyle Shen, Ithaca, NY (US); Christopher Parzyck, Freeville, NY (US)

(73) Assignee: Cornell University, Ithaca, NY (US)

( * ) Notice: Subject to any disclaimer, the term of this patent is extended or adjusted under 35 U.S.C. 154(b) by 443 days.

(21) Appl. No.: 18/068,568

(22) Filed: Dec. 20, 2022

(65) Prior Publication Data

US 2024/0136178 A1 Apr. 25, 2024

Related U.S. Application Data

(60) Provisional application No. 63/416,730, filed on Oct. 17, 2022.

(51) Int. Cl.
*H01L 21/02* (2006.01)
(52) U.S. Cl.
CPC .. *H01L 21/02565* (2013.01); *H01L 21/02414* (2013.01); *H01L 21/02579* (2013.01); *H01L 21/02631* (2013.01)

(58) Field of Classification Search
CPC ......... H01L 21/02565; H01L 21/02414; H01L 21/02631; H01L 21/02579
See application file for complete search history.

(56) References Cited

U.S. PATENT DOCUMENTS

2015/0348680 A1\* 12/2015 Wang ................... H10N 60/203
174/125.1

\* cited by examiner

*Primary Examiner* — Suberr L Chi
(74) *Attorney, Agent, or Firm* — Withrow & Terranova, PLLC

(57) ABSTRACT

Various embodiments disclosed herein provide for several methods of fabricating p-type semiconductors with industrially relevant hole mobilities that are back end of the line (BEOL) compatible. A first method of fabrication includes forming a buffer layer on a substrate, forming a palladium oxide layer over the buffer layer, annealing the palladium oxide layer, and then forming a cap layer over the palladium oxide layer, then cooling the stack, wherein each step is performed at a variety of predefined temperatures. Each of the substrate, buffer layer and cap layer can be magnesium oxide. A second method includes forming a palladium oxide layer over a titanium dioxide substrate, annealing the stack, and then cooling the stack, all performed at a different variety of predefined temperatures.

21 Claims, 9 Drawing Sheets

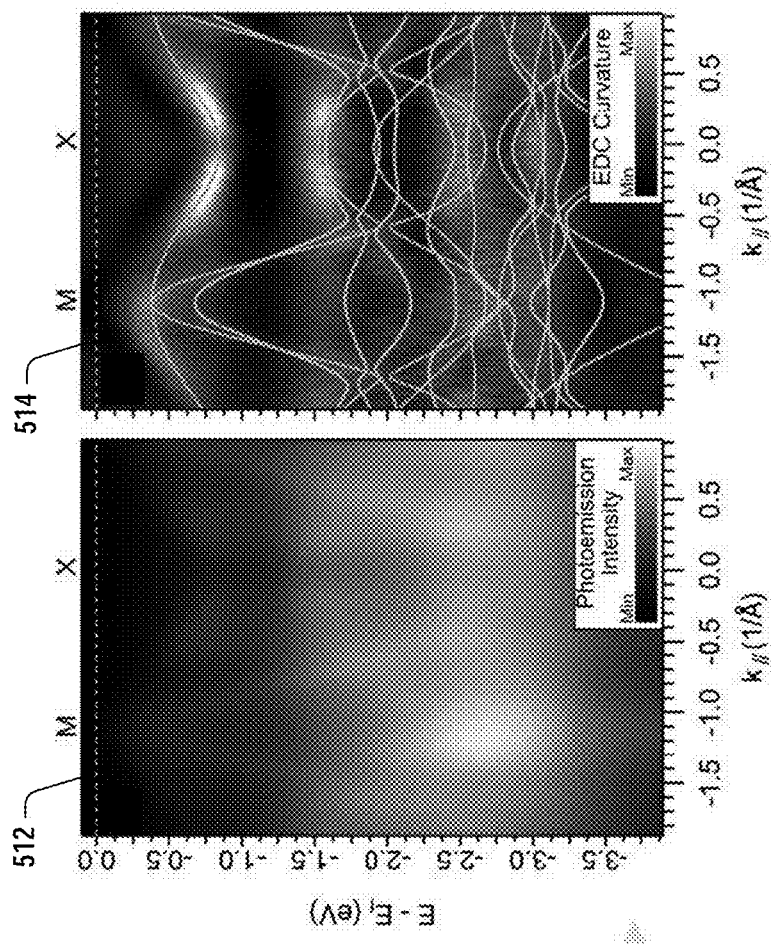
FIG. 5G
FIG. 5F
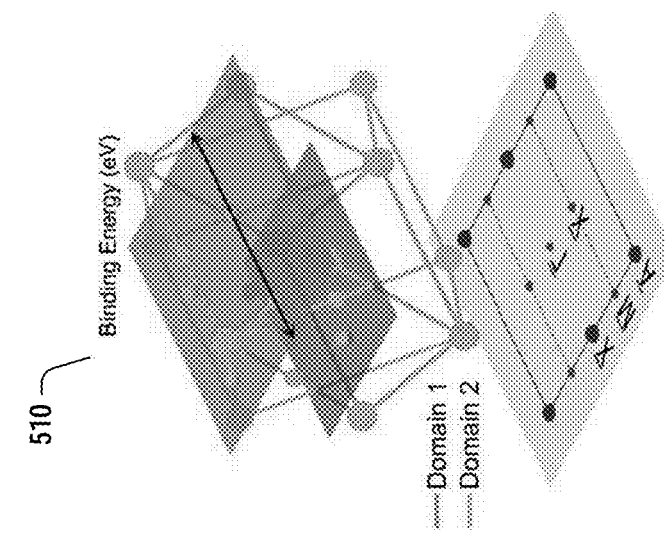
FIG. 5E

CORRELATED ORBITALS YIELD HIGH-MOBILITY, BACK-END-OF-LINE COMPATIBLE P-TYPE OXIDE SEMICONDUCTOR

RELATED APPLICATIONS

This application claims the benefit of provisional patent application Ser. No. 63/416,730, filed Oct. 17, 2022, the disclosure of which is hereby incorporated herein by reference in its entirety.

GOVERNMENT SUPPORT

This invention was made with government funds under Agreement No. HR0011-18-3-0004 awarded by The Defense Advanced Research Projects Agency (DARPA). The U.S. Government has certain rights in this invention.

FIELD OF THE DISCLOSURE

The subject disclosure relates to methods for fabricating a p-type semiconductor from a hole-doped charge-transfer insulator, and more particularly to fabricating p-type semiconductors with industrially relevant hole mobilities that are back end of the line (BEOL) compatible.

BACKGROUND

While key advancements including the adoption of high dielectric constant (high-κ) dielectrics and fin field-effect transistor (FinFET) architectures have successfully sustained transistor scaling over the last decade, a gap is gradually opening up between prediction and process capabilities in advanced nodes. To close this gap, innovative transistor architectures such as monolithic three-dimensional integrated circuits or vertical complementary oxide semiconductor (CMOS) have been proposed. One of the key materials challenges of this technology is the identification of back-end-of-line (BEOL) compatible p-type semiconductor materials with high hole mobility. Among the candidates of materials families (oxide, III-Nitride, Group IV, and III-V), oxide materials have the distinct advantages of retaining crystal quality and electrical characteristics at lower deposition temperature. In the oxide family, while high-performance devices based upon n-type semiconducting oxides such as indium gallium zinc oxide (IGZO), $\beta$-$Ga_2O_3$, and La-doped $BaSnO_3$ are abundant, p-type semiconducting oxides with sufficiently high hole mobilities to make them relevant to logic and memory applications remain elusive.

SUMMARY

Various embodiments disclosed herein provide for several methods of fabricating p-type semiconductors with industrially relevant hole mobilities that are back end of the line (BEOL) compatible. A first method of fabrication includes forming a buffer layer on a substrate, forming a hole-doped charge-transfer insulator layer over the buffer layer, annealing the hole-doped charge-transfer insulator layer, and then forming a cap layer over the hole-doped charge-transfer insulator layer, then cooling the stack, wherein each step is performed at a variety of predefined temperatures. Each of the substrate, buffer layer, and cap layer can be magnesium oxide. A second method includes forming a hole-doped charge-transfer insulator layer over a titanium dioxide substrate, annealing the stack, and then cooling the stack, all performed at a different variety of predefined temperatures. In various embodiments, the hole-doped charge-transfer insulator can be palladium oxide, or another charge-transfer insulator. In other embodiments, the p-type semiconductors can include Mott-Hubbard insulators or hole-doped Mott-Hubbard insulators.

In an embodiment, a method of fabrication of a p-type semiconductor from a hole-doped charge-transfer insulator includes forming a homoepitaxial buffer layer on a substrate at a first temperature. The method also includes forming a hole-doped charge-transfer insulator layer on the homoepitaxial buffer layer at a second temperature lower than the first temperature. The method also includes annealing the hole-doped charge-transfer insulator with ozone at a third temperature higher than the second temperature. The method also includes forming a cap layer over the hole-doped charge-transfer insulator at the third temperature to form a stack, wherein the homoepitaxial buffer layer, cap layer, and substrate are the same material. The method also includes cooling the stack in a vacuum to the second temperature at a predefined cooling rate.

In another embodiment, a method of fabrication of a p-type semiconductor from a hole-doped charge-transfer insulator includes forming a hole-doped charge-transfer insulator layer on a substrate at a first temperature, wherein the hole-doped charge-transfer insulator layer and the substrate form a stack. The method also includes annealing the stack with ozone at a second temperature higher than the first temperature. The method also includes cooling the stack in a vacuum to a third temperature lower than the first temperature and the second temperature at a predefined cooling rate In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 5A-5G are graphs depicting various measurements performed on a p-type semiconductor according to some embodiments of the disclosure;

DETAILED DESCRIPTION

Figure 1:
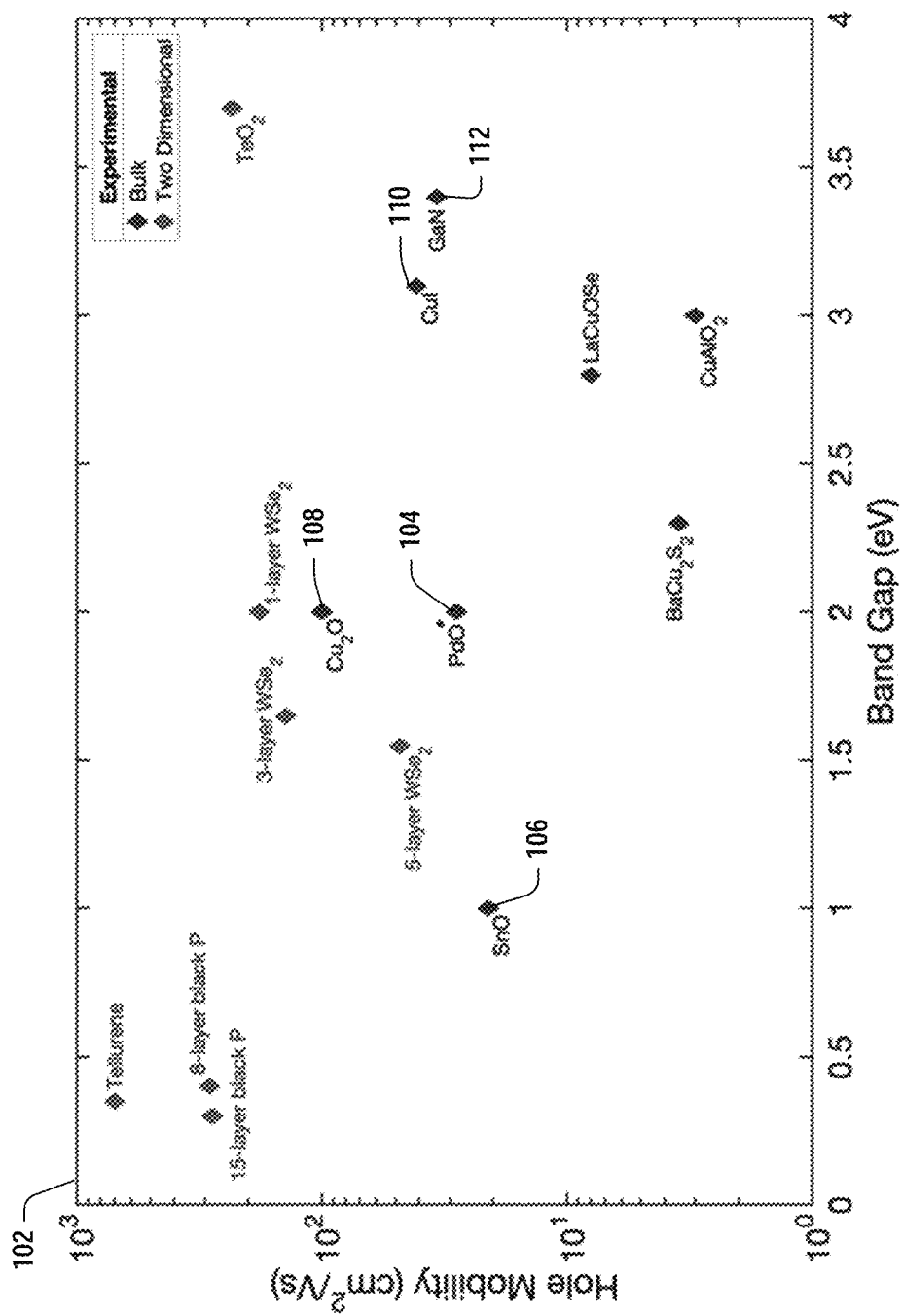
FIG. 1 is an illustration of a graph depicting experimental hole mobility vs band gap of candidate p-type semiconductors according to some embodiments of the disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Various embodiments disclosed herein provide for several methods of fabricating p-type semiconductors with industrially relevant hole mobilities that are back end of the line (BEOL) compatible. In various embodiments, the p-type semiconductors can be hole-doped charge-transfer insulators or Mott-Hubbard insulators, or hole-doped Mott-Hubbard insulators. These materials can be strong electron correlation effects that have been missed by prior high-throughput theoretical screening methods. An example of such a material is palladium oxide. Reference throughout the application has been made to palladium oxide, but it is to be appreciated that the p-type semiconductors referenced herein can be any of a family of materials including hole-doped charge-transfer insulators or Mott-Hubbard insulators, or hole-doped Mott-Hubbard insulators.

A first method of fabrication includes forming a buffer layer on a substrate, forming a palladium oxide layer over the buffer layer, annealing the palladium oxide layer, and then forming a cap layer over the palladium oxide layer, then cooling the stack, wherein each step is performed at a variety of predefined temperatures. Each of the substrate, buffer layer and cap layer can be magnesium oxide. A second method includes forming a palladium oxide layer over a titanium dioxide substrate, annealing the stack, and then cooling the stack, all performed at a different variety of predefined temperatures.

The fundamental limits to the hole mobilities of oxide semiconductors are rooted in the curvature of the valence band maximum. In oxides the valence band maximum is typically dominated by contributions from O 2p orbitals, resulting in highly localized flat bands, large effective mass, and hence low hole mobilities. Indeed most oxide semiconductors have hole mobilities that are smaller than 1 cm$^2$ V$^{-1}$ s$^{-1}$ at room temperature. One of the strategies of identifying and engineering promising p-type oxides with high mobility is therefore based on the introduction of occupied metal orbitals with similar energy to O 2p that are more extended in order to promote hybridization with the O 2p orbitals. Such a hybridized valence band has greater bandwidth, larger band curvature, and higher hole mobilities. Through this design principle, $Sn^{2+}$ and $Cu^{1+}$-based families of compounds such as SnO, $Cu_2O$, and $CuAlO_2$ have emerged as promising p-type oxide semiconductors. To date they are the most popular subjects of research in p-type semiconductors along with two-dimensional (2D) materials, which is an emerging class of high performance semiconductor materials. To highlight the current landscape of most promising p-type semiconductors, their figures of merit (FOM), namely band gap and hole mobilities at room temperature, are shown in FIG. 1.

As seen in the FOMs plot above, 2D p-type semiconductors such as $WSe_2$ and black phosphorous (black P) have much higher mobilities than bulk semiconductors, which is partly attributed to the reduced carrier scattering in 2D systems. The current widespread application of 2D semiconductors are still limited, however, partly due to challenges in fundamental physics, materials synthesis, and processing. One issue is the relatively lower drive currents in comparison to bulk counterparts due to varying sample qualities and high contact resistance. A second issue is the 2D semiconductor devices are typically based on exfoliated flakes rather than epitaxial growth of uniform thin films. Efforts to prepare epitaxial films of TMDs by metal-organic chemical vapor deposition (MOCVD) and molecular-beam epitaxy (MBE) have mostly resulted in polycrystalline material with fiber texture so far.

The bulk p-type semiconductor candidates are therefore still the focal point of large-scale integration efforts. As shown in FIG. 1, other than Si, the bulk p-type semiconductor candidates with industrially relevant hole mobilities are SnO 106, $Cu_2O$ 108, CuI 1 210, and GaN 112. Among these the only BEOL-compatible ($T_{growth}$<~400° C.) candidates yielding the high FOMs shown are SnO 106 and CuI 198. While bulk p-GaN and GaN-based two dimensional hole gas (2DHG) have excellent hole mobilities (>30 $cm^2$ $V^{-1}$ $s^{-1}$) and device performance, their epitaxial growth require higher thermal budget than allowed in BEOL processes. For SnO 106 and CuI 110, high quality epitaxial films of both materials have both been demonstrated at BEOL growth temperatures with high mobilities, which make them competitive candidates for device studies. To be a viable candidate for vertical field-effect transistors (FET) in logic and memory access devices at upper layer of the BEOL, however, the channel materials should ideally have band gaps larger than 1.5 eV and long term chemical stabilities. Unfortunately, both SnO 106 and CuI 110 have significant drawbacks. The experimental band gap of SnO 106 (~1 eV is relatively low for many applications and epitaxial CuI thin films have been shown to suffer from degradation in ambient conditions due to oxygen interdiffusion, even with capping.

Presented is another p-type oxide semiconductor candidate that can be readily deposited as blanket films at BEOL-compatible temperature with properties that alleviate both of the aforementioned challenges. PdO 104 was first identified and studied in 1967 as a p-type semiconductor; it has been all but forgotten in the ensuing years. This is partly due to the poor sample quality of the old polycrystalline PdO films and the difficulty in accurately calculating the electronic structure of PdO using density functional theory (DFT). The local-density approximation (LDA) that is used in high-throughput DFT calculations does not accurately calculate the exchange-correlation terms to properly account for the significant energetic contribution of electron-electron interactions involving d or f electrons. For many semiconductor materials, LDA works fine because d or f electrons are not involved in the valence and conduction bands, so there is no issue. The $Pd^{2+}$ in PdO, however, has a $d^8$ electron configuration. Due to strong electron correlation effects in PdO as well as other $d^8$ semiconductors like NiO, PdO, and PtO, ordinary DFT predicts all of them to be metals. Undoped NiO is in fact a well-known antiferromagnetic Mott insulator with an experimentally measured band gap of 4.3 eV. There have been various attempts at hole doping NiO with limited success giving rise to hole mobility lower than 1 $cm^2$ $V^{-1}$ $s^{-1}$. In contrast, although experimental studies have established PdO as a p-type semiconductor, research on this material has all but ceased until recently.

In pursuit of p-type semiconductors that can be deposited at BEOL-compatible temperatures, it is demonstrated the epitaxial growth of single-crystal PdO thin films on $TiO_2$ and MgO substrates using ozone-assisted molecular-beam epitaxy (MBE). Through optical spectroscopic ellipsometry, PdO can be established as a direct gap p-type semiconductor with a 2.05 eV band gap. By matching the optical band gap with hybrid functional DFT calculations, the theoretical mobility is calculated to be as high as 13.6 and 460 $cm^2$ $V^{-1}$ $s^{-1}$ for the heavy and light hole bands at room temperature, respectively. Using angle resolved photoemission spectroscopy (ARPES) the valence band structure of PdO is observed for the first time and agreement with many aspects of the hybrid functional DFT calculations are found. The Hall hole mobility of epitaxial PdO is measured to be as high as 28 $cm^2$ $V^{-1}$ $s^{-1}$, but it is observed to degrade in air over time due to unintentional doping from excess oxygen. Through a combined post-growth ozone annealing, in situ MgO capping, and vacuum cool down process, the carrier concentration control and electrical stability is demonstrated without unintentional doping in air for a MgO/PdO (100)/ MgO epitaxial stack with the epitaxial MgO capping layer as thin as 2.5 nm.

Epitaxial PdO thin films were synthesized using a Veeco Gen10 molecular beam epitaxy (MBE) system. Cross-sectional layers of the PdO semiconductors are depicted in FIGS. 2A and 2B.

Figure 2A:
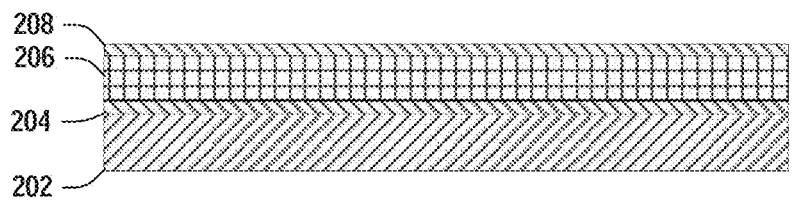
FIGS. 2A and 2B illustrate cross-sectional views of the p-type semiconductors according to some embodiments of the disclosure.

A first p-type semiconductor is depicted in FIG. 2A that has a magnesium oxide substrate 202, a buffer layer 204, a PdO layer 206, and a cap layer 208. The buffer layer and the cap layer can both be made out of MgO.

Figure 2B:
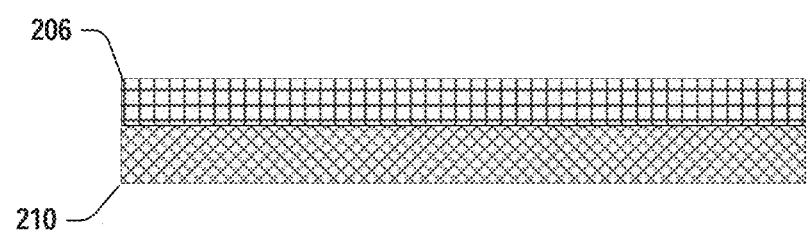

In FIG. 2B, a different p-type semiconductor is depicted that has a PdO layer 206 over a titanium dioxide substrate 210.

Palladium (99.999%, ESPI Metals) and magnesium (99.99%, Sigma-Aldrich) molecular beams are evaporated from thermal effusion cells and deposited onto $TiO_2$ and MgO substrates (CrysTec GmbH) under atmospheres of ~10% or distilled $O_3$(~80% $O_3$+20% $O_2$) with background pressures of $1\times10^{-6}$ Torr. The substrate temperatures (as measured by a thermocouple close to, but not in direct contact with the substrate) are maintained at 300° C. and 200° C. for PdO/$TiO_2$ and PdO/MgO growths, respectively, and increased to up to 400-500° C. in post-growth $O_3$ annealing. Prior to growth, the $TiO_2$ substrates are etched in dilute HCl and HF acids and annealed in air at 850° C. for 3 hours to prepare a step-and-terrace morphology. The hydroscopic MgO substrates are annealed in vacuum up to 750° C. to improve the surface quality. In MgO/PdO stacks, a ~5 nm homoepitaxial MgO buffer is first grown on the vacuum annealed MgO substrates at 750° C. before the PdO growth at 200° C. Following O$_3$ annealing at 500° C., an epitaxial MgO cap layer is then grown on the PdO at 500° C. before the bilayer stack is cooled down in vacuum to 200° C. at a cooling rate of 150° C./min. The process steps and corresponding reflection high-energy electron diffraction (RHEED) images of MgO/PdO/homoepitaxial MgO/MgO stacks and PdO/TiO$_2$ are shown in FIG. 3 and FIG. 4, respectively.

Figure 3:
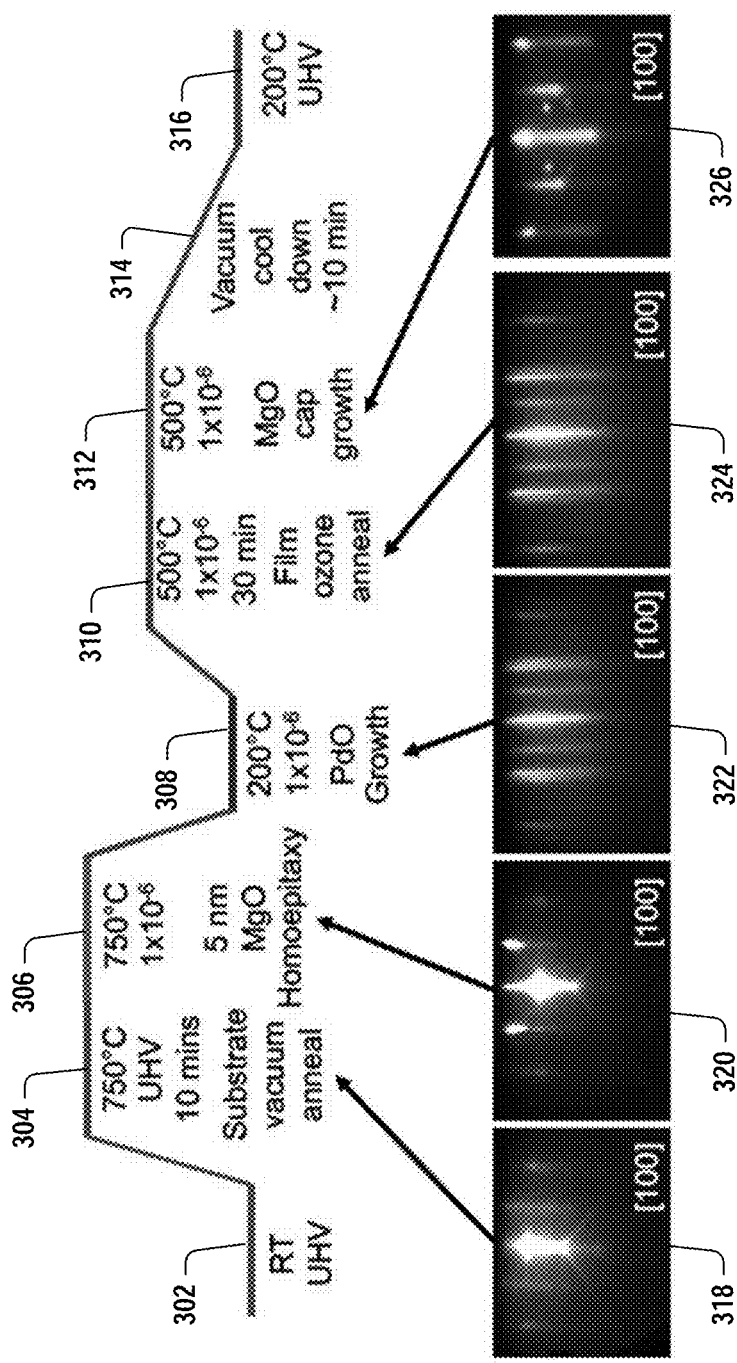
FIG. 3 is an illustration of a molecular beam epitaxy growth recipe for a p-type semiconductor with a magnesium oxide substrate according to some embodiments of the disclosure.

FIG. 3 is an illustration of a molecular beam epitaxy growth recipe for a p-type semiconductor with a magnesium oxide substrate according to some embodiments of the disclosure. At 302, the MgO substrate is prepared in an ultra-high vacuum (UHV), and at 304, the MgO substrate is annealed at 750° C. for 10 minutes, and then at 306, a homoepitaxial buffer layer of MgO of 5 nm is formed, also at 750° C. Then the buffer layer and substrate are cooled to 200° C. at 308 to grow the PdO layer at 308. Once formed, the PdO layer is annealed at 500° C. with ozone for around 30 minutes at 310, then the MgO cap layer is formed at 500° C. at 312. Then at 314 the stack is cooled down for 10 minutes, at a predefined cooling rate that can be at or near 150° C./minute and then it is held at 316 at 200° C. for a predefined period of time. The RHEED images 318, 320, 322, 324, and 326 are taken with an electron beam along the substrate direction show the bare MgO substrate, after the growth of a 5 nm thick homoepitaxial MgO buffer layer, the as-grown and ozone-annealed 33.4 nm thick PdO layer, and following the ~4 nm thick MgO capping layer, respectively.

Figure 4:
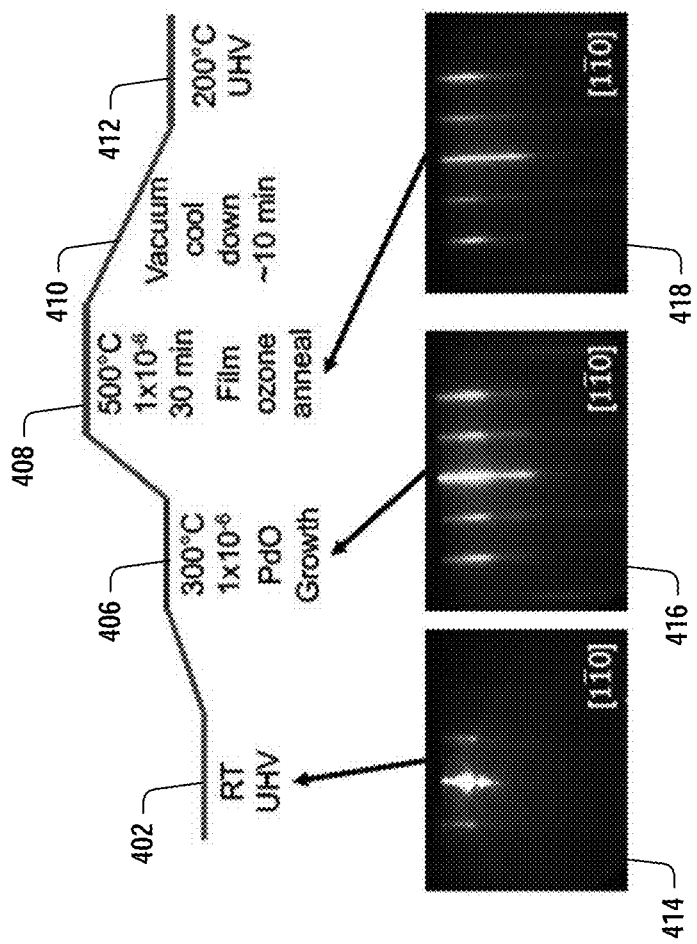
FIG. 4 is an illustration of a molecular beam epitaxy growth recipe for a p-type semiconductor with a titanium dioxide substrate according to some embodiments of the disclosure.

FIG. 4 is an illustration of a molecular beam epitaxy growth recipe for a p-type semiconductor with a titanium dioxide substrate according to some embodiments of the disclosure. At 402, the TiO$_2$ substrate is prepared in an ultra-high vacuum (UHV), and at 406 that PdO layer is formed at 500° C. Once formed, the PdO layer is annealed at 500° C. with ozone for around 30 minutes at 408, then the stack is cooled down for 10 minutes at 410, at a predefined cooling rate that can be at or near 150° C./minute and then it is held at 412 at 200° C. for a predefined period of time.

The RHEED images 414, 416, and 418 are taken with an electron beam along the substrate direction during the growth of such an epitaxial heterostructure, show the bare TiO$_2$ (110) substrate, the as-grown and ozone-annealed 10 nm thick PdO layer, respectively.

X-ray diffraction (XRD) measurements have been carried out using a PANalytical Empyrean four-circle X-ray diffractometer using Cu-K$\alpha_1$ radiation. The film thicknesses are extracted using fast Fourier transform (FFT) of X-ray reflectivity (XRR) measurements. Reflection high-energy electron diffraction (RHEED) patterns are collected using a kSA 400 RHEED system from Staib instruments. Atomic force microscopy (AFM) images are measured using an Asylum Cypher environmental AFM system. Cross-sectional scanning transmission electron microscopy (STEM) specimens are prepared by focused ion beam (FIB) lift-out using a Thermo Scientific Helios G4 UX FIB. The FIB lamellae are imaged using an aberration corrected Thermo Fisher Scientific Spectra 300 STEM with a cold field-emission gun operating at 300 kV with a 30 mrad aperture.

DFT calculations are implemented in the Vienna Ab-Initio Simulation Package (VASP) version 5.4.4 using the Projector-Augmented Wave (PAW) method. Details of the calculations, including convergence criteria, are described in the supplementary materials. In order to account for the electronic correlation that is essential in understanding PdO, both Dudarev-type U-correction and hybrid functional (HSE06) are pursued, which are described in detail in the supplementary materials.

Band structures are computed using the selected functionals with optimized parameters. The diagonal elements of the effective mass tensor are then extracted from parabolic fitting of the band extrema. Carrier mobilities are calculated using a phonon-limited model as described in our previous work; the Phonopy package is used to calculate phonon frequencies. To elucidate the origin of the observed intrinsic conductivity in PdO, charged defect formation energies are calculated for palladium and oxygen interstitial and vacancy defects. 4×4×2 supercells are used to minimize the impact of defect-defect interactions. Given the computational cost of defect studies, it is not feasible to do a comparative study of different functionals, so only HSE06 (with α=0.37) is used.

Angle-resolved photoemission spectroscopy (ARPES) measurements are carried out in a custom analysis chamber with a base pressure of 5×10$^{-11}$ Torr using a helium plasma discharge lamp and a VG Scienta R4000 hemispherical electron analyzer.

Optical measurements of a 49.1 nm thick PdO/MgO sample are carried out using a single rotating compensator multichannel ellipsometer (M-2000 Fl, J. A Woollam, Co. Inc). Ellipsometry spectra are collected at incidence angles of 50° and 70° over a photon energy range of 0.74 to 5.50 eV. The spectra are fitted by iterative least squares regression using a structural and optical model, which minimizes the unweighted error function or mean square error to extract the complex dielectric function spectra and other structural properties. The structural model consists of semi-infinite MgO/PdO thin film/ambient air layers and the reference optical properties are used for MgO.

Hall measurements are carried out at room temperature using a Nanometrics HL5500 Hall system in an applied magnetic field of $\mu_0 H$=0.5 T. All measurements are carried out in a van der Pauw geometry and indium contact pads are soldered onto samples with MgO capping layers prior to measurements PdO crystallizes in the $$P\frac{4_2}{m}mc$$

space group (space group 131) where the main structural motif is square planar coordinated PdO$_4$. While there are no commercially available bulk substrates with the same crystal structure as PdO and similar lattice parameters, two heteroepitaxial platforms are identified, namely (011)-oriented PdO on (110)-oriented TiO$_2$ and (100)-oriented PdO on (001)-oriented MgO substrates. For the PdO/TiO$_2$ system, the lattice mismatch is highly anisotropic. The lattice mismatch between PdO and TiO$_2$ are −2.3% and 6.0% along TiO$_2$ [001] and [1$\bar{1}$0] directions, respectively.

The lattice mismatch anisotropy is evident in RHEED where the diffraction patterns with the electron beam parallel to PdO[100]/TiO$_2$[001] are smooth and sharp while that with the electron beam parallel to PdO[0$\bar{1}$1]/TiO$_2$[1$\bar{1}$0] are broader and more diffuse. Due to the large lattice mismatch anisotropy, the surface is quasi-one dimensional with ribbon like features along the low strain PdO[100]/TiO$_2$[001] direction and gaps along the orthogonal PdO[0$\bar{1}$1]/TiO$_2$[1$\bar{1}$0] direction. Despite the quasi-1 D morphology, the film surface is atomically smooth with a rms roughness of 1.65 Å, which is comparable to the TiO$_2$ substrate. The PdO film is (011) oriented, phase pure, and has smooth surface and abrupt film-substrate interface, as evident from the XRD θ-2θ scan and XRR spectra in FIGS. 2(d), (e). The PdO film is relaxed due to the large lattice and symmetry mismatches with $TiO_2$. The in-plane epitaxial relationships of PdO[100]||$TiO_2$[001] (and PdO[0$\bar{1}$1]||$TiO_2$[1$\bar{1}$0]) and the twin variant PdO[$\bar{1}$00]||$TiO_2$[001] (and PdO[01$\bar{1}$]||$TiO_2$[1$\bar{1}$0]) are confirmed by asymmetric φ scans in where the PdO 010 and $TiO_2$ 200 peaks overlap. The rotational twinning of PdO (011) grown on $TiO_2$(110) is evident through comparison with the stereographic projection where only one PdO 010 reflection is expected.

The highly crystalline structures and atomically sharp substrate-film interfaces are also observed in the high-angle annular dark field scanning transmission electron microscopy (HAADF-STEM) images along two orthogonal zone axes. While an atomically abrupt interface is observed along the $TiO_2$ zone axis, the film-substrate interface is more diffuse when viewed along the $TiO_2$ zone axis due to the anisotropy in lattice mismatch. The in-plane epitaxial relationship between PdO and $TiO_2$ are also confirmed with the crystal structure overlays along two zone axes. While the 180° in-plane rotational twinning is not directly observable in HAADF mode due to lack of oxygen sensitivity, other extended defects such as out-of-phase boundaries are readily observed.

For PdO grown on MgO(001), despite the small lattice mismatch between PdO(001) and MgO(001) planes with a 450 in-plane rotation (−1.65%), PdO is observed to grow (100) oriented on MgO(001), as shown in an XRD θ-2θ scan. The resulting (100)-oriented PdO film is twinned due to the 4-fold symmetry of the MgO(001) substrate giving rise to two in-plane rotation variants (related by 90° in-plane rotation twinning): PdO[001]||MgO[110] and PdO[001]||MgO[1$\bar{1}$0]. This twinned orientation relationship involves a lattice mismatch of +11.8% and −1.7% along PdO[001]||MgO[$\bar{1}$10] and PdO[010]||MgO[110] directions, respectively. That the epitaxial PdO film on MgO adopts this more mismatched orientation relationship is hypothesized to arise from the surface energy differences between (001) and (100) planes of PdO, where the latter have lower energy.

The sharp streaks in the RHEED patterns and well-defined oscillations in XRR indicate that the 33.5 nm thick epitaxial PdO is highly crystalline and smooth with an abrupt film substrate interface. The smoothness of the PdO surface is also corroborated with a rms roughness of 1.95 Å as measured from the AFM image. Similar to PdO grown on $TiO_2$(110), PdO on MgO(001) is also structurally relaxed, as evidenced by the broader FWHM of 0.11° of the PdO 100 reflections than the 0.015° FWHM of the MgO 002 reflection in the symmetric rocking curves. The 900 in-plane rotational twinning between the (100)-oriented PdO domains is also apparent from the observation of rectangle features with 900 rotation in the AFM image and asymmetric φ scans where the PdO011 reflections are 450 rotated from MgO220 reflections. The epitaxial relationship is therefore PdO(100)||MgO(001) and PdO[001]||MgO[$\bar{1}$10] for one twin variant and PdO(100)||MgO(001) and PdO[001]||MgO[110] for the other twin variant. The rotational twinning is also confirmed by comparison of φ scans with stereographic projections. The highly crystalline structures and atomically sharp substrate-film interfaces are also observed in the high-angle annular dark field scanning transmission electron microscopy (HAADF-STEM) images. The twin boundary between (100)-oriented PdO domains is a straight line perpendicular to the MgO(001) surface. This twin boundary is highlighted by the yellow dashed line. The twin domains are clearly distinguished by the PdO structure overlays in magnified images in the side panel.

The heteroepitaxial growth of PdO on $TiO_2$(110) and MgO(001) provide two platforms for fundamental materials science studies and eventual device applications. The large band gap of MgO is advantageous for establishing the optical band gap of PdO by spectroscopic ellipsometry measurements as described below. Another advantage of MgO is its industrial accessibility. Highly oriented MgO (001) template layers, suitable for epitaxial overgrowth, are made in kilometer-long lengths by ion beam assisted deposition (IBAD) at room temperature on arbitrary surfaces, including amorphous ones. This accessibility makes smooth MgO surfaces possible for BEOL integration. On the other hand, the (011)-oriented PdO on $TiO_2$(110) facilitates the experimental observation of the valence band structure of PdO at the M point in the Brillouin zone by ARPES. As can be seen experimentally and is also predicted by first-principles calculations, the top of the valence band of PdO indeed occurs at the M point. While advantageous for revealing the band structure of PdO, epitaxial PdO on $TiO_2$ is less relevant to industrial application due to the ease of n-type doping of the $TiO_2$ substrate by oxygen vacancies.

One of the difficulties in accurately calculating the electronic structure of PdO originates from the uncertainty in the true band gap of PdO. Ordinary density functional theory (DFT) predicts PdO to be a metal and a U-correction parameter or hybrid functionals are needed to open a gap, as shown in the supplementary materials. This problem is exasperated in the uncertainty of experimentally measured band gap values, which remain a topic of discussion in the literature with reported values of the band gap of PdO between 0.8 eV and 2.67 eV. These values were measured on polycrystalline PdO films except for a measurement on a PdO single crystal sample by Weber et al. who reported a band gap of 2.5 eV. To further elucidate this puzzle and to aid our theoretical calculations, optical spectroscopic ellipsometry analyses were carried out on a 49.1 nm thick PdO(100)/MgO(001) film. The analyses indicate that the optical band gaps along the in-plane and out-of-plane directions are both direct and the band gap values are measured to be 2.0 eV and 2.5 eV, respectively. Note that the out-of-plane band gap of 2.5 eV of our epitaxial PdO film is in excellent agreement with the single crystal value reported by Weber et al. Moreover, a free-carrier absorption feature is observed in the in-plane direction at lower photon energies as represented by the Drude expression. This feature is not observed in the out-of-plane direction due to the higher conductivity in the in-plane direction. The precise determination of the optical band gap of our films is indispensable in the accurate calculation of the electronic structure by DFT. While calculations utilizing the local density or generalized gradient approximation for exchange interactions originally predicted PdO to be a metal the addition of either a Hubbard U correction (e.g., PBE+U) or Hartree-Fock exchange (e.g., HSE06) in DFT calculations opens a gap in the calculated electronic structure. It is found that an unphysically large value of $U_{eff}$=8.7 eV is required to match the experimentally measured gap of 2.05 eV, and this choice of $U_{eff}$ results in lattice parameters inconsistent with measured bulk values. The hybrid functional HSE06, on the other hand, yields more consistent results: a choice of α=0.37 yields excellent agreement with both the band gap and measured lattice parameters. The band structures and density of states (DOS) calculated using HSE06 (α=0.37) and PBE+U ($U_{eff}$=8.7 eV). Both calculations show PdO to be a direct gap semiconductor with band extrema at the M point. The predicted valence band structure is similar in both calculations, showing a pair of heavy and light hole bands at the valence band maximum. Both calculations yield macroscopically similar features, and the band gaps match; however, PBE+U and HSE06 produce dissimilar microscopic results. This is most apparent in the density of states, where DFT+U assigns the valence band edge features ($0 \leq E_b - E_{VBM} \leq 2$ eV) primarily to O 2p states, whereas HSE06 attributes them primarily to Pd 4d states.

Figure 5A:
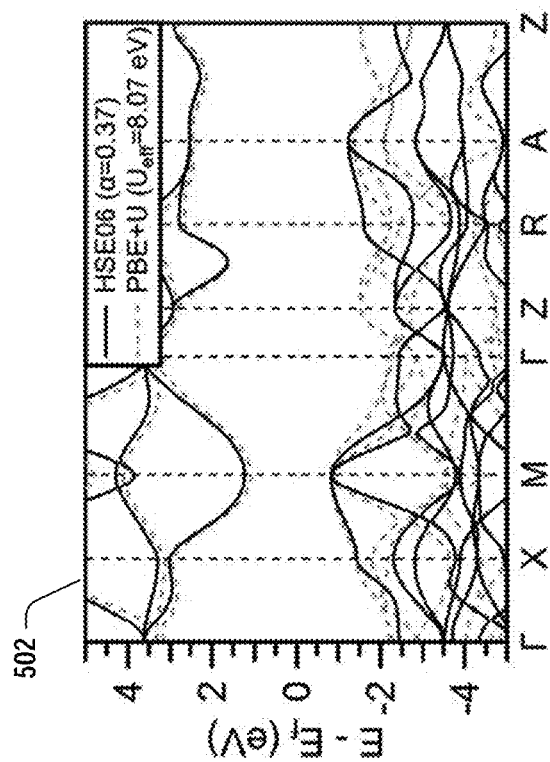
Figure 5B:
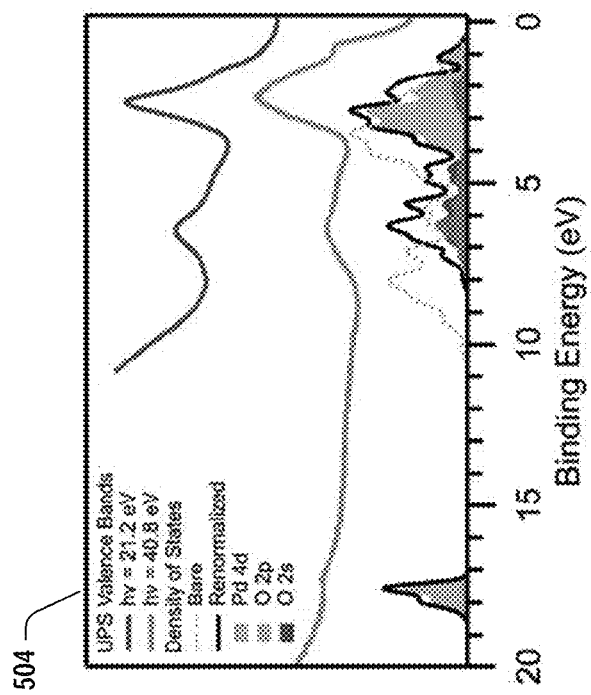

To more precisely characterize the electronic structure of our PdO(011)/TiO$_2$(110) films, in situ UPS/ARPES measurements were performed in an analysis chamber connected via UHV manifold to the growth system; the results are summarized in FIGS. 5A-5G (with additional spectra provided in the supplemental materials). FIG. 5A in graph 502 depicts a calculated electronic structure using PBE+U (solid) and HSE06 (dashed) methods. The UPS valence bands are shown in FIG. 5B in graph 504 and the HSE06 DOS are provided for reference. The peak structure of the valence bands measured with He-I (hv=21.2 eV) and He-II (hv=40.8 eV) matches well with the calculated DOS and with previous UPS measurements of PdO, albeit with improved energy resolution. However, the bandwidth of the Pd 4d/O 2p manifold predicted by HSE06 is substantially wider (10.3 eV) compared to our measurements here (7.0±0.5 eV) and previous UPS data (7.0-7.5 eV)[79,80]. An additional renormalization about $E_{VBM}$ of R=0.78 is required to align the two. Finally, the photon energy dependence of the photoionization cross section can be used to shed light on the orbital character of the valence bands. Using values for the photoionization cross section, σ, c, it is noted that when moving from He-I to He-II the O 2p cross section is reduced from 10.7 to 6.8 Mb, whereas the Pd 4d cross section is enhanced from 26.1 to 32.5 Mb. As a result, the sensitivity to the Pd states over the 0 states near the band edge, $\sigma_{Pd4d}/\sigma_{O2p}$, is enhanced by a factor of two in He-II over He-I. The suppression of the intensity between 4.0 and 8.5 eV and enhancement between 0 and 1.5 eV is consistent with the HSE06 prediction that those states are of majority O 2p and Pd 4d character, respectively.

Figures 5C, 5D:
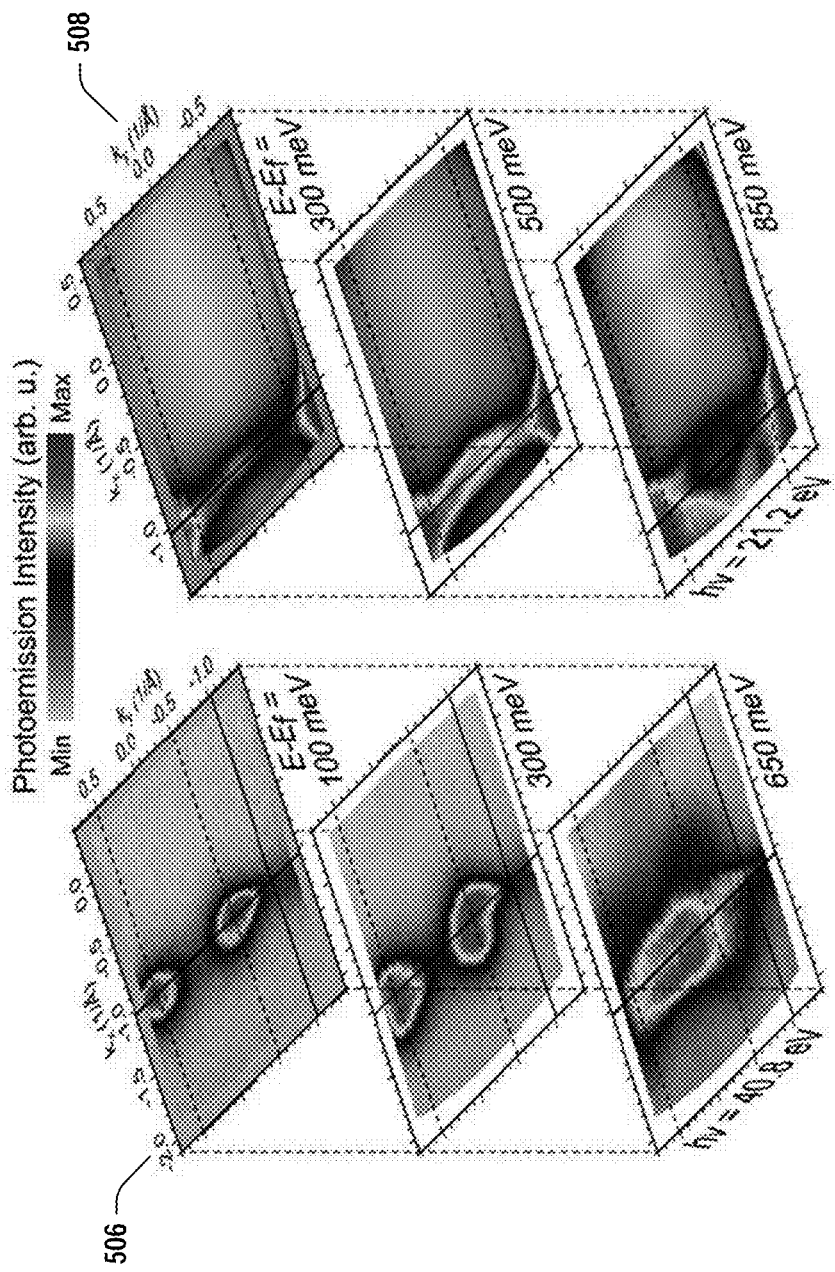

Turning to the momentum resolved electronic structure, FIGS. 5C and 5D depict a set of constant energy intensity maps 506 and 508 taken with He-II and He-I light, respectively; regions of high intensity indicate measured band positions, in momentum space, at each binding energy. The nominal locations of these maps in momentum space (translated to the first Brillouin zone) are shown in FIG. 5E. In both FIGS. 5C and 5D, the observed band maxima occur along the $\overline{X}$-$\overline{M}$-$\overline{A}$ line in the projected zone, with weak dispersion along that line and strong dispersion in the $\overline{G}$-$\overline{X}$ direction (nominally along the a* axis), as is expected from both DFT+U and HSE06 calculations. It is noted that with He-II the band maxima (at $E-E_f \sim 100$ meV) occur very nearly on the high symmetry points in the projected zone, at $\overline{M}$ which signals that this slice goes nearly through the true high symmetry points M and X. Conversely, in He-I (FIG. 5D) the band extrema occur off the projected high symmetry points, indicating this slice does not pass through, but is close to, the G point. By carefully comparing the HSE06 band structure predictions and observed ARPES spectra along the projected high-symmetry lines (using both He-I and He-II) a qualitative estimate of the inner potential can be made and determine the out-of-plane momenta corresponding to each photon energy-He-I=3.3 Å$^{-1}$ and He-II=2.4 Å$^{-1}$. Having done so the calculated band structure is overlayed on corresponding ARPES spectra. A comparison of the HSE06 bands (again, renormalized by a factor of R=0.78) is plotted against the EDC curvature corresponding to a cut through the M and X points in FIG. 5F in graph 512, and 5G in graph 514. Excellent agreement is observed between the calculated and measured band positions, in particular, at the band edge where the heavy-hole and light-hole bands are clearly visible.

Having imposed agreement between the experimentally informed theoretical calculations and ARPES spectra; HSE06 calculations are then used to calculate the intrinsic carrier mobilities of PdO at room temperature to assess its potential as a p-type semiconductor. Even though the choices of functionals give rises to noticeable differences in band structures and DOS, the calculated effective masses of carriers in PdO are reasonably similar between PBE+U and HSE06 functionals. The room temperature theoretical phonon-limited carrier mobilities calculated using HSE06 (α=0.37) are tabulated in Table 1 depicted below. The results show that PdO is an ambipolar semiconductor and that the mobility tensor is highly anisotropic. While the theoretical hole mobility along the c-axis is the same for the heavy- and light-hole bands at 28.9 cm$^2$ V$^{-1}$ s$^{-1}$, the theoretical mobility along the a- and b-axes of the light hole band is 460 cm$^2$ V$^{-1}$ s$^{-1}$. This is ~34 times larger than that of the heavy hole band, 13.6 cm$^2$ V$^{-1}$ s$^{-1}$, along these same directions.

TABLE 1

| Carrier type | Effective Mass ($m^*/m_0$) | | | Drift Mobility ($cm^2V^{-1}s^{-1}$) | | | Hall Mobility ($cm^2V^{-1}s^{-1}$) | | |
|---|---|---|---|---|---|---|---|---|---|
| | a | b | c | a | b | c | a | b | c |
| Electron | 1.940 | 1.940 | 0.969 | 29.4 | 29.4 | 83.2 | 46.7 | 46.7 | 132.2 |
| Heavy Hole | −3.397 | −3.397 | −2.051 | 12.7 | 12.7 | 27.0 | 13.6 | 13.6 | 28.9 |
| Light Hole | −0.324 | −0.324 | −2.051 | 430.1 | 430.1 | 27.0 | 460.2 | 460.2 | 28.9 |

The potential of PdO as candidate material for BEOL p-channel MOSFET is thus apparent from the calculated results in Table 1. The theoretical heavy-hole mobility is among the highest of bulk p-type semiconductors and other BEOL candidates, as shown in FIG. 1 and the light-hole mobility is comparable to that of Si. Accessing the alluring transport of the light-hole bands would require a means of raising their energies to lie above the heavy hole counterpart. The successes of the strained Si processes in raising channel mobilities in Si MOSFET makes this an interesting pursuit for future studies.

Hall mobility measurements reveal our epitaxial PdO films grown on both TiO$_2$ and MgO substrates to be unintentionally doped p-type semiconductors. The room-temperature Hall hole mobility is measured to be as high as 28 and 16 cm$^2$ V$^{-1}$ s$^{-1}$ for PdO(011)/TiO$_2$ and PdO(100)/MgO, respectively. Moreover, the as-grown films are observed to be susceptible to unintentional doping in ambient conditions upon removal from vacuum. The measured hole mobility decreases while the carrier concentration increases concurrently upon exposure to ambient conditions for a 10 nm thick PdO (011) film grown on TiO$_2$(110) as well as for a 33.6 nm thick PdO (100) film grown on MgO(001). For both systems, the carrier concentration asymptotes to the 1019 to $10^{20}$ level of holes per $cm^3$ within hours of the films being exposed to 1 atm of air.

To uncover the origins of the charged defects and the mechanism of unintentional doping of PdO, the charge transition levels (CTL) of PdO relative to the chemical potentials of palladium and $O_2$ are calculated using DFT. The formation energies of palladium and oxygen vacancies are positive, but those of the palladium and oxygen interstitials are both negative indicating their tendencies to form spontaneously. Note that both oxygen defect types (vacancies and interstitials) appear to favor the neutral charge state across the entire energy range. This is due to the high electroactivity of the palladium and highlights a peculiarity of CTLs in redox-capable materials. In the case of oxygen interstitials, the nearby palladium ions oxidize into a more positive charge state and hence introduces hole carriers. The unintentional p-type doping of PdO therefore likely originates from the spontaneous formation of oxygen interstitials, i.e., $PdO_{1+\delta}$, during growth with $O_3$ as well as upon air exposure with atmospheric species.

To further understand the potential roles of interstitial oxygen on the p-type doping of PdO, two approaches are taken to either reduce the oxygen content after film growth or prevent further oxidation in ambient conditions. The first approach is to immediately follow the film growth by an in situ ozone anneal in the MBE at a substrate temperature 400-500° C. for up to 30 minutes and then to cool the film down in vacuum to 200° C. These additional in situ processing steps not only lead to a reduction in the oxygen content in the PdO film due to the exponential decrease in oxidation potential with increasing temperatures, but also gives rise to a smoother surface morphology as shown in the RHEED images in FIG. 3 (318-226) and in FIG. 4 (414-418). Note that direct growth at a substrate temperature of 400-500° C. results in significantly roughened surfaces. The second approach is in situ epitaxial growth of an MgO capping layer before vacuum cool down, as shown in the recipe schematic in FIG. 3. The epitaxially grown MgO capping layer is introduced to prevent further oxidation and doping when the sample is exposed to air.

The combination of a post-growth ozone anneal, vacuum cooldown, and in situ MgO capping is found to be the most effective in suppressing ambient oxidation and hence further unintentional doping. From the data it is evident that the epitaxial stack is stable for the duration of the time-stamped measurement up to 10 days. The challenge of carrier-concentration control in as-grown epitaxial PdO films arises partly from the unintentional doping upon air exposure, which is an essentially uncontrolled process giving rise to varying magnitudes of unintentional doping as a function of measurement time. The MgO capping only and ozone annealing only treatments have little to no effect on the carrier-concentration control as well. This indicates that neither process alone effectively suppresses the unintentional doping that occurs during the growth under an $O_3$ atmosphere and postgrowth air exposure. The combined processes of post-growth ozone annealing and in situ MgO capping, however, gives rises to epitaxial MgO/PdO stacks with the lowest carrier concentrations that are stable against ambient unintentional doping with MgO caps as thin as 2.5 nm.

Note that while the post-growth ozone annealing, vacuum cool-down, and in situ MgO capping are demonstrated to be effective at reducing carrier concentrations, the epitaxial PdO film remains conductive. More aggressive treatments such as ozone annealing above 500° C. and prolonged vacuum annealing lead to reduction of PdO into metallic palladium, which has also been observed in recent study. Due to the difficulty in oxidizing palladium, growth under oxygen atmospheres gives rises to metallic palladium as well. Carrier concentration scales strongly with film thickness, where the carrier concentration decreases with increasing film thicknesses for as-grown, annealed only, capped only, and annealed and capped films. This observation implies that the magnitude of unintentional doping changes with thickness, i.e., the film in proximity to the film-substrate interface is more doped than the film away from it. While not yet fully understood, several mechanisms are proposed to explain this observation. Since the PdO film has a very different crystal structure from the substrates, the atomic arrangements of PdO in the interfacial regions are more distorted from the bulk crystal structure in heteroepitaxial growth. The resulting structural defects in heteroepitaxial growth may become electrically charged by either accommodating excess oxygen or trapping holes. With increasing film thicknesses, the defects annihilate and the film structure approaches that of the bulk equilibrium structure and the doping level decreases. This does not imply that infinitely thick PdO, i.e., a bulk single crystal, is electrically insulating. The defect calculations above suggest that PdO is likely self-doped in which the excess oxygen is a thermodynamically stable defect contributing to finite conductivity.

Similar to (100)-oriented PdO on MgO(001) substrates, carrier-concentration control is difficult in as-grown and ozone annealed only films for (011) PdO on $TiO_2$(110) substrates. The carrier concentration also scales strongly with film thickness. The strategy of ozone annealing, vacuum cool-down and capping in situ with MgO or $TiO_2$ in tandem resulted in the substrate or capping layer becoming electrically conductive, however, due to the eases of inducing oxygen vacancies in $TiO_2$. This phenomenon unfortunately precludes the accurate assessment of p-type behavior in epitaxial PdO capped with or grown on $TiO_2$ due to the presence of parallel conduction paths and both electron and hole carriers. The effectiveness of other means of reducing carrier concentrations in $PdO/TiO_2$, such as alternative capping materials, will be explored in subsequent studies.

In summary, PdO is a promising BEOL-compatible p-type semiconductor with low effective mass and high hole mobility. Using MBE epitaxial thin films of PdO have been deposited on commercially available $TiO_2$ and MgO substrates. Using spectroscopic ellipsometry it has been unambiguously established that PdO can be a direct gap semiconductor with a band gap of 2.05 eV. Hybrid functional DFT calculations predict a pair of heavy- and light-hole bands at the valence band maximum, which are also observed experimentally using ARPES for the first time. The theoretical phonon-limited mobilities are calculated to be as high as 28.9 and 460.2 $cm^2$ $V^{-1}$ $s^{-1}$ for the heavy- and light-hole bands at room temperature. Experimentally, the Hall mobility is observed to be as high as 28 and 16 $cm^2$ $V^{-1}$ $s^{-1}$ at room temperature for PdO (011) grown on $TiO_2$(110) substrates and PdO(100) grown on MgO(001) substrates, respectively. The hole mobilities are observed to decrease upon air exposure due to unintentional doping, but the combination of ozone annealing, in situ capping with epitaxial MgO, and cooling down in vacuum effectively suppresses this process.

Figure 6:
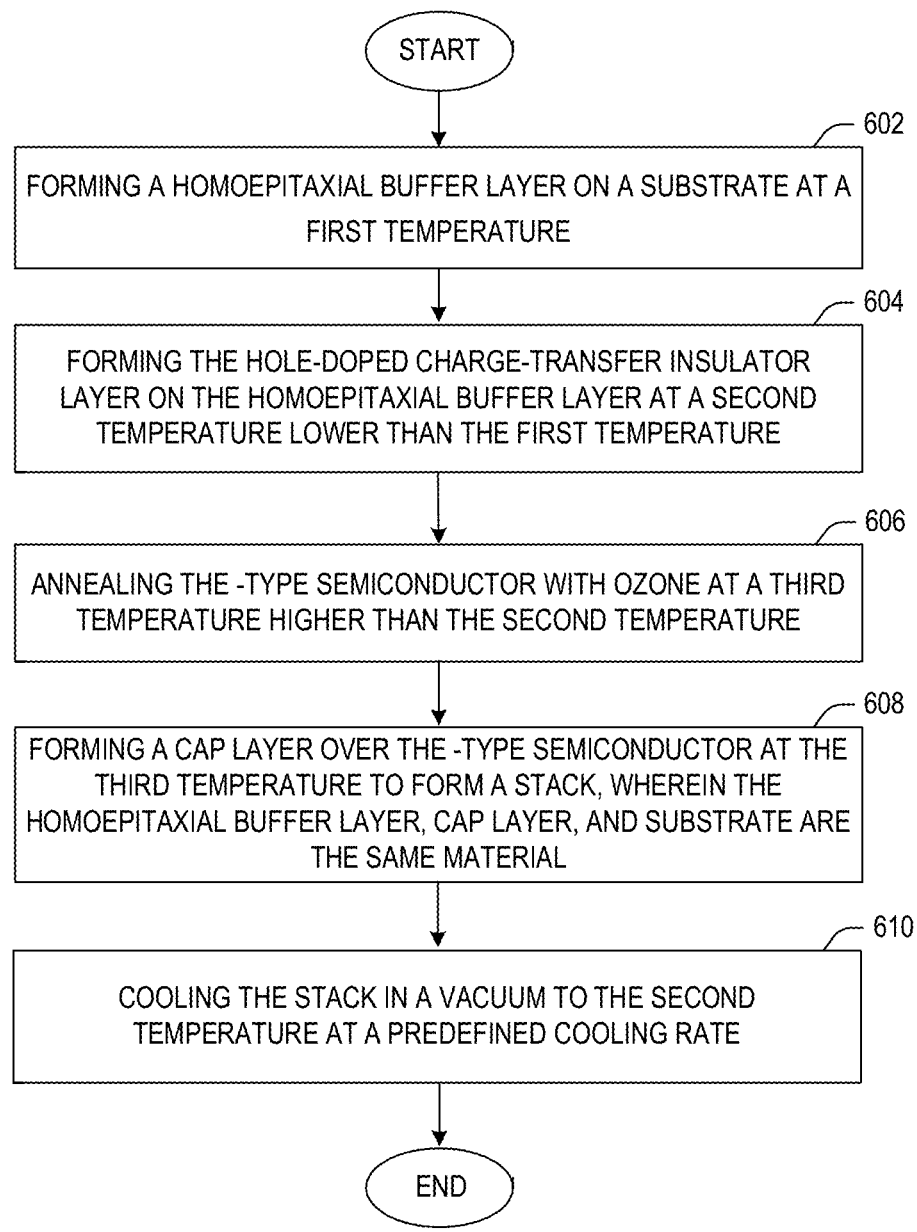
FIG. 6 is a flowchart of a method for fabricating a p-type semiconductor according to some embodiments of the disclosure.

FIG. 6 illustrates a flowchart of a method for fabricating a p-type semiconductor from a hole-doped charge-transfer insulator according to some embodiments of the disclosure.

The method can begin at step 602 where the method includes forming a homoepitaxial buffer layer on a substrate at a first temperature. In an embodiment, the first temperature can be at or near 750° C. Furthermore, prior to forming the homoepitaxial buffer layer, the substrate can be annealed at the 750° C. temperature for around 10 minutes in a vacuum. In an embodiment, the homoepitaxial buffer layer is between 4-6 nm.

At step 604, the method includes forming the hole-doped charge-transfer insulator layer on the homoepitaxial buffer layer at a second temperature lower than the first temperature. In an embodiment, the second temperature can be at or near 200° C. The hole-doped charge-transfer insulator layer can be between 33-34 nm. In various embodiments, the hole-doped charge-transfer insulator layer can be palladium oxide.

At step 606, the method includes annealing the p-type semiconductor with ozone at a third temperature higher than the second temperature. In an embodiment, the third temperature can be at or near 500° C. and the annealing can be performed for between 25-35 minutes.

At step 608, the method includes forming a cap layer over the p-type semiconductor at the third temperature to form a stack, wherein the homoepitaxial buffer layer, cap layer, and substrate are the same material. In an embodiment, the buffer layer, substrate and the cap layer are magnesium oxide.

In an embodiment, the cap layer can be between 3-5 nm.

At step 610, the method includes cooling the stack in a vacuum to the second temperature at a predefined cooling rate. In an embodiment, the predefined cooling rate can be at or near 150° C./minute.

Figure 7:
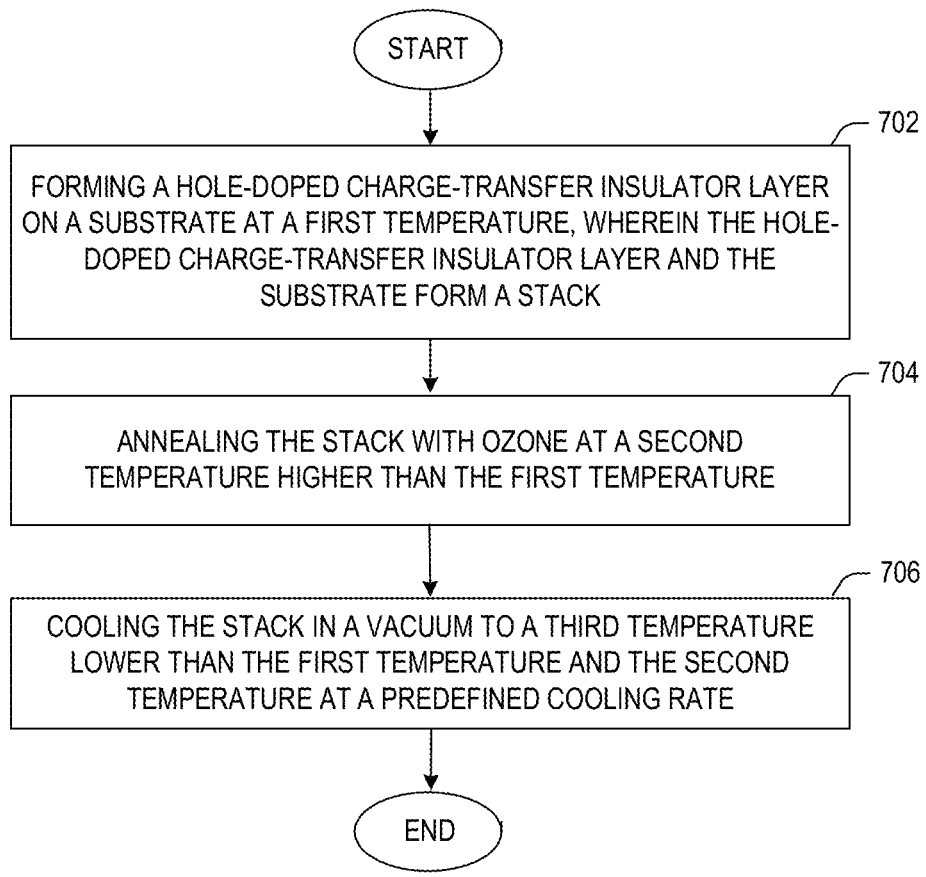
FIG. 7 is a flowchart of a method for fabricating a p-type semiconductor according to some embodiments of the disclosure.

FIG. 7 illustrates a flowchart of a method for fabricating a p-type semiconductor according to some embodiments of the disclosure.

The method can begin at step 702 where the method includes forming a hole-doped charge-transfer insulator layer on a substrate at a first temperature, wherein the hole-doped charge-transfer insulator layer and the substrate form a stack. The hole-doped charge-transfer insulator layer can be between 9-11 nm.

In an embodiment, the hole-doped charge-transfer insulator layer can be palladium oxide.

At step 704, the method includes annealing the stack with ozone at a second temperature higher than the first temperature.

At step 706, the method includes cooling the stack in a vacuum to a third temperature lower than the first temperature and the second temperature at a predefined cooling rate. In an embodiment, the first temperature is at or near 300° C., the second temperature is at or near 500° C., and the third temperature is at or near 200° C., and the predefined cooling rate is 150° C./minute.

In an embodiment, prior to forming the palladium oxide layer, etching the titanium dioxide in an acid mixture comprised of HCl acid and/or HF acid, and annealing the titanium dioxide at 850° C. for 3 hours.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method of fabrication of a p-type semiconductor from a hole-doped charge-transfer insulator, comprising:
   forming a homoepitaxial buffer layer on a substrate at a first temperature;
   forming the hole-doped charge-transfer insulator layer on the homoepitaxial buffer layer at a second temperature lower than the first temperature;
   annealing the p-type semiconductor with ozone at a third temperature higher than the second temperature;
   forming a cap layer over the p-type semiconductor at the third temperature to form a stack, wherein the homoepitaxial buffer layer, cap layer, and substrate are the same material; and
   cooling the stack in a vacuum to the second temperature at a predefined cooling rate.

2. The method of claim 1, wherein, the hole-doped charge-transfer insulator is palladium oxide.

3. The method of claim 1, wherein the buffer layer, substrate and the cap layer are magnesium oxide.

4. The method of claim 1, wherein the first temperature is 750° C., the second temperature is 200° C., and the third temperature is 500° C.

5. The method of claim 1, wherein the predefined cooling rate is 150° C./minute.

6. The method of claim 1, further comprising:
   prior to forming the homoepitaxial buffer layer, annealing the substrate at the first temperature for 10 minutes in a vacuum.

7. The method of claim 1, wherein the homoepitaxial buffer layer is between 4-6 nm.

8. The method of claim 1, wherein the annealing is performed for a length of time between 25-35 minutes.

9. The method of claim 1, wherein the hole-doped charge-transfer insulator layer has a thickness between 33-34 nm.

10. The method of claim 1, wherein the cap layer has a thickness between 3-5 nm.

11. The method of claim 1, wherein the forming the hole-doped charge-transfer insulator layer is by molecular beam epitaxy.

12. A method of fabrication of a p-type semiconductor from a hole-doped charge-transfer insulator, comprising:
   forming a hole-doped charge-transfer insulator layer on a substrate at a first temperature, wherein the hole-doped charge-transfer insulator layer and the substrate form a stack;
   annealing the stack with ozone at a second temperature higher than the first temperature; and
   cooling the stack in a vacuum to a third temperature lower than the first temperature and the second temperature at a predefined cooling rate.

13. The method of claim 12, wherein the hole-doped charge-transfer insulator is palladium oxide.

14. The method of claim 12, wherein the substrate is titanium dioxide.

15. The method of claim 14, further comprising:
   prior to forming the hole-doped charge-transfer insulator layer, etching the titanium dioxide in an acid mixture, and annealing the titanium dioxide at 850° C. for 3 hours.

16. The method of claim 15, wherein acid mixture is one or more of hydrochloric acid and hydrofluoric acid.

17. The method of claim 12, wherein the first temperature is 300° C., the second temperature is 500° C., and the third temperature is 200° C.

18. The method of claim 12, wherein the predefined cooling rate is 150° C./minute.

19. The method of claim 12, wherein the hole-doped charge-transfer insulator layer is between 9-11 nm.

20. The method of claim 12, wherein the stack forms an epitaxial heterostructure.

21. The method of claim 12, wherein the forming the hole-doped charge-transfer insulator layer is by molecular beam epitaxy.

* * * * *